United States Patent
Cornelius (10) Patent No.: US 8,041,981 B2
(45) Date of Patent: Oct. 18, 2011

(54) SYNCHRONIZING TIMING DOMAINS BASED ON STATE VARIABLES

(75) Inventor: William P. Cornelius, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 595 days.

(21) Appl. No.: 12/238,274

(22) Filed: Sep. 25, 2008

(65) Prior Publication Data

US 2010/0073044 A1    Mar. 25, 2010

(51) Int. Cl.
*G06F 1/24* (2006.01)
(52) U.S. Cl. ........................................ 713/500
(58) Field of Classification Search .......... 713/500–503; 375/354, 373
See application file for complete search history.

(56) References Cited

U.S. PATENT DOCUMENTS

| | | | | |
|---|---|---|---|---|
| 4,809,221 A | * | 2/1989 | Magliocco et al. | 713/401 |
| 5,446,867 A | * | 8/1995 | Young et al. | 713/503 |
| 5,848,265 A | * | 12/1998 | Maas et al. | 713/500 |
| 5,963,602 A | * | 10/1999 | Aoki et al. | 375/354 |
| 6,023,769 A | * | 2/2000 | Gonzalez | 713/400 |
| 6,061,073 A | * | 5/2000 | Larson | 345/501 |
| 6,864,722 B2 | * | 3/2005 | Adkisson | 327/12 |
| 7,596,711 B2 | * | 9/2009 | Asplund et al. | 713/500 |
| 7,702,945 B2 | * | 4/2010 | Shibayama et al. | 713/501 |
| 7,913,104 B1 | * | 3/2011 | Cory et al. | 713/503 |
| 2004/0236979 A1 | * | 11/2004 | Wilcox et al. | 713/500 |
| 2006/0129961 A1 | * | 6/2006 | Paul et al. | 716/6 |

* cited by examiner

*Primary Examiner* — Paul Myers
(74) *Attorney, Agent, or Firm* — Park, Vaughan, Fleming & Dowler LLP; Steven E. Stupp (57) ABSTRACT

Embodiments of a synchronization circuit, a method for synchronizing clock signals, and electronic devices that include the synchronization circuit or a computer-program product (e.g., software) with instructions for operations in the method are described. This synchronization circuit synchronizes clock signals in different timing domains using state variables. In particular, the synchronization circuit generates a synchronization acquisition curve based on a temporal history of state-variable differences between the clock signals. Next, the synchronization circuit synchronizes the clock signals (without a discontinuous temporal transient in one or more state variables of a dependent one of the clock signals) based on the sum of the synchronization acquisition curve and the state-variable differences between the clock signals. This state variable may include: a phase of the dependent clock signal, a frequency of the dependent clock signal, and/or a rate of change of the frequency of the dependent clock signal.

31 Claims, 5 Drawing Sheets

SYNCHRONIZING TIMING DOMAINS BASED ON STATE VARIABLES

BACKGROUND

1. Field of the Invention

The present invention relates to synchronization circuits and synchronization techniques. More specifically, the present invention relates to a synchronization circuit that synchronizes different timing domains based on state variables.

2. Related Art

Many integrated circuits contain different functional blocks that operate at different speeds. As a consequence, these integrated circuits may include different timing domains. Because the different functional blocks in these integrated circuits often interact with each other, it is typically useful to synchronize or lock the clock signals in the different timing domains. For example, the clock signals from different timing domains may be synchronized using a phase-locked loop.

However, existing synchronization techniques typically bring the frequency and the phase of the clock signals into lock in a nonlinear or an unpredictable manner. For example, the frequency and the phase of the clock signals being locked are often a nonlinear function of time.

This nonlinear or erratic behavior of the clock signals during synchronizing can cause problems in a variety of applications. For example, if clock signals in a media transport system have nonlinear variations while they are being locked, there may be undesirable transients in resulting audio signals that users can perceive. More generally, nonlinear or erratic variations in clock signals during synchronization can adversely impact data transport in a series of cascaded circuits.

Hence, what is needed are synchronization circuits and techniques that overcome the problems listed above.

SUMMARY

One embodiment of the present invention provides a synchronization circuit that determines state-variable differences between two clock signals in two timing domains (e.g., using a comparison circuit), and collects a temporal history of the state-variable differences (e.g., using an aggregation circuit). Next, the synchronization circuit generates a synchronization acquisition curve based on the temporal history (e.g., using an estimation circuit), and sums the state-variable differences with the synchronization acquisition curve (e.g., using a summation circuit). Moreover, the synchronization circuit determines a dependent one of the two clock signals based on the sum of the state-variable differences and the synchronization acquisition curve (e.g., using a synchronization processing circuit in a feedback loop that receives the sum and outputs the dependent one of the two clock signals).

This synchronization circuit may allow the clock signals to be synchronized without a discontinuous temporal transient in one or more state variables of the dependent clock signal. For example, the 'continuous' state variable may include: a phase of the dependent clock signal, a frequency of the dependent clock signal, and/or a rate of change of the frequency of the dependent clock signal. In some embodiments, the sum of the state-variable differences and the synchronization acquisition curve is approximately zero at the beginning of the synchronization of the clock signals.

For discrete signals, temporal continuity of the 'continuous' state variable may include: a magnitude of a phase change in the dependent clock signal during a time interval that is less than a predetermined value when synchronization the clock signals; and/or a magnitude of a frequency change in the dependent clock signal during a time interval that is less than another predetermined value when synchronization the clock signals.

At a given time, the temporal history may include a phase difference and a frequency difference between the clock signals.

Moreover, the synchronization acquisition curve may correspond to (i.e., may be or may be a function of) a smooth and continuous function of time of the phase difference between the clock signals. This smooth and continuous function may include: a linear dependence of the phase difference on time, a quadratic dependence of the phase difference on time, and/or a cubic dependence of the phase difference on time. For example, at the beginning of the synchronization of the clock signals, the synchronization acquisition curve may be based on a phase-difference trajectory as a function of time, which includes: a phase difference, a frequency difference, and/or a rate of change of the frequency difference between the clock signals.

In some embodiments, the synchronization acquisition curve is determined based, at least in part, on a transfer function of a feedback loop between an output of the summation circuit and an input of the comparison circuit, which includes the synchronization processing circuit.

Note that the synchronization circuit may be disposed on an integrated circuit.

Another embodiment provides an electronic device that includes the synchronization circuit.

Another embodiment provides a method including at least some of the above-described operations.

Another embodiment provides a computer-program product for use in conjunction with a computer system, which includes instructions for at least some of the above-described operations.

Another embodiment provides the computer system.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
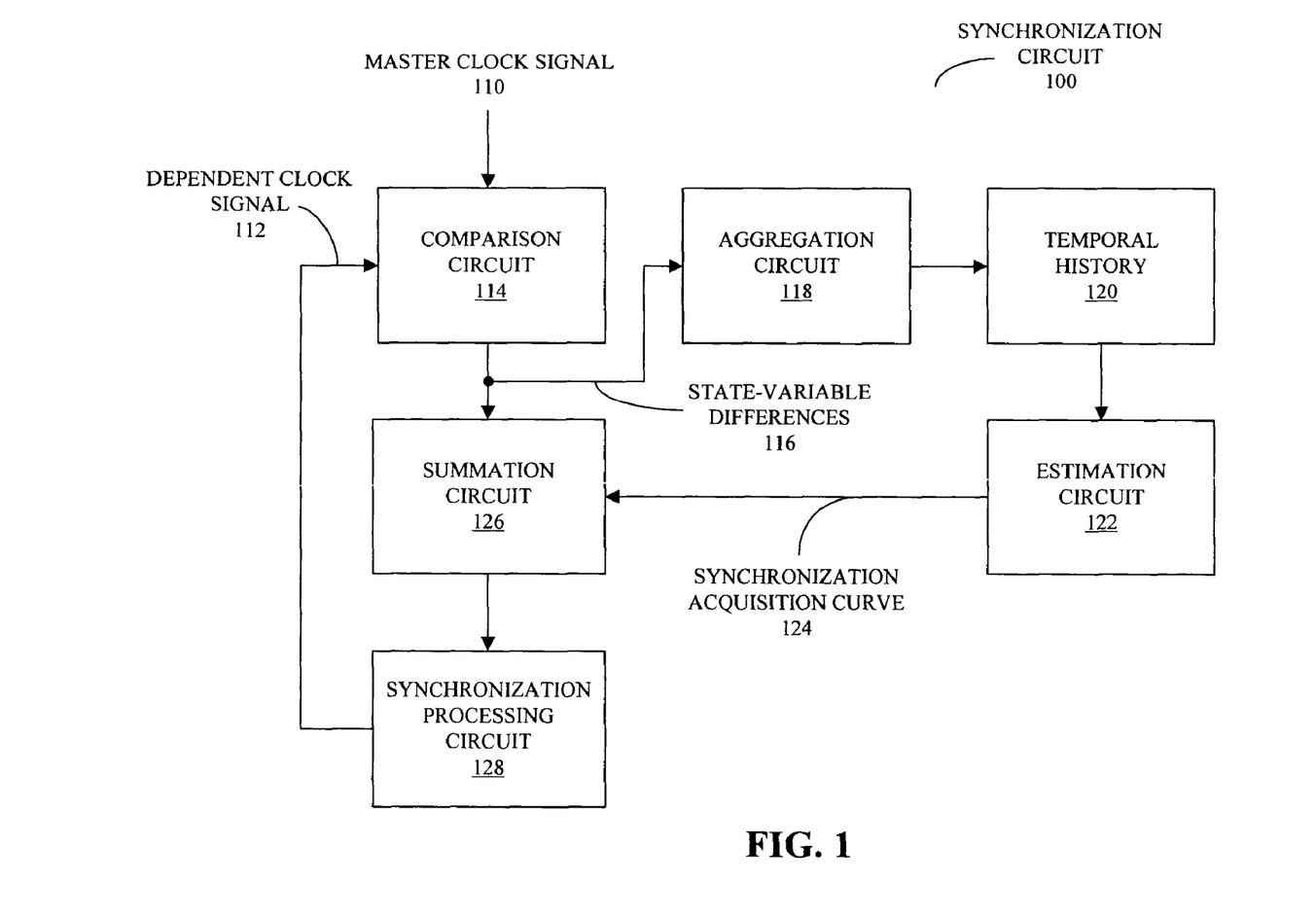
FIG. 1 is a block diagram illustrating a synchronization circuit in accordance with an embodiment of the present invention.

Embodiments of a synchronization circuit, a method for synchronizing clock signals, and electronic devices that include the synchronization circuit or a computer-program product (e.g., software) with instructions for operations in the method are described. FIG. 1 presents a block diagram illustrating a synchronization circuit 100 that synchronizes clock signals in different timing domains using state variables. In this synchronization circuit, a comparison circuit 114 determines state-variable differences 116 between two clock signals in two timing domains (including master clock signal 110 and a slave or dependent clock signal 112), and an aggregation circuit 118 (such as a counter) collects a temporal history 120 of the state-variable differences 116 between the master clock signal 110 and the dependent clock signal 112. This temporal history may include phase differences, frequency differences and/or a rate of change of the frequency differences between these clock signals as a function of time.

An estimation circuit 122 in synchronization circuit 100 generates a synchronization acquisition curve 124 based on the temporal history 120 that is used to navigate from the existing phase and frequency of the dependent clock signal 112 to the phase and frequency of the master clock signal 110 during the synchronizing in a controlled manner. This synchronization acquisition curve may correspond to (i.e., may be or may be a function of) a smooth and, at least, a piecewise continuous function of time of the phase difference between the master clock signal 110 and the dependent clock signal 112.

The smooth and continuous function may include: a linear dependence of the phase difference on time, a quadratic dependence of the phase difference on time, and/or a cubic dependence of the phase difference on time. For example, at the beginning of the synchronization of the master clock signal 110 and the dependent clock signal 112, the synchronization acquisition curve 124 may be based on a phase-difference trajectory as a function of time, which includes: a phase difference, a frequency difference, and/or a rate of change of the frequency difference between the clock signals.

Thus, the synchronization acquisition curve 124 may be differentiable, and may have a well-defined first derivative and/or a well-defined second derivative as function of time. In general, the synchronization acquisition curve 124 may be selected based on the desired continuity order (e.g., zero, first or second order), limits on the frequency change during the synchronizing, and/or the desired lock time during which the synchronizing occurs (e.g. the time during which residual differences between the master clock signal 110 and the dependent clock signal 112 become less than a residual level). For example, the synchronization acquisition curve 124 is generated so that the lock time is less than one second (such as 1 ms).

Moreover, a summation circuit 126 in synchronization circuit 100 sums the state-variable differences 116 with the synchronization acquisition curve 124. This sum defines the residual or adjusted error during the synchronizing. Because the synchronization acquisition curve 124 is generated based on the temporal history 120, the sum output by summation circuit 126 may be well behaved or predictable during the synchronizing of master clock signal 110 and dependent clock signal 112. For example, the sum may be approximately zero at the beginning of the synchronization of the clock signals (which can prevent the occurrence of a step error), i.e., the target phase and frequency presented to synchronization processing circuit 128 at the start of the synchronization may be near the phase and frequency of the dependent clock signal 112. Subsequent values of the synchronization acquisition curve 124 may slowly move the target phase and frequency (and thus phase and frequency of the dependent clock signal 112) to those of the master clock signal 110. Thus, summation circuit 126 may subtract the synchronization acquisition curve 124 from the state-variable differences 116 or the minus sign may be included when estimation circuit 122 generates the synchronization acquisition curve 124.

Synchronization processing circuit 128 in synchronization circuit 100 determines dependent clock signal 112 based on the sum of the state-variable differences 116 and the synchronization acquisition curve 124. During the synchronizing of the master clock signal 110 and the dependent clock signal 112, the predictability of the sum output by summation circuit 126 may allow these clock signals to be synchronized without a discontinuous temporal transient in one or more state variable of dependent clock signal 112 (which are sometimes referred to as one or more 'continuous' state variables). The one or more continuous state variables may include: a phase of the dependent clock signal 112, a frequency of the dependent clock signal 112, and/or a rate of change of the frequency of the dependent clock signal 112.

Thus, this technique for synchronizing clock signals may bound temporal changes in the one or more continuous state variables when synchronizing the master clock signal 110 and the dependent clock signal 112. For discrete signals, temporal continuity of the one or more continuous state variables may include: a magnitude of a phase change in the dependent clock signal 112 during a time interval that is less than a predetermined value when synchronizing the clock signals; and/or a magnitude of a frequency change in the dependent clock signal 112 during a time interval that is less than another predetermined value when synchronizing the clock signals. For example, in an audio application with 100,000 computations per second and a resolution of one part per million (ppm) or better (such as a 32-bit calculation), the phase change per computation may be less than tens of picoseconds and the frequency change may be less than 500 ppm/s.

By bringing the master clock signal 110 and the dependent clock signal 112 into phase and frequency lock based on the temporal history 120 of state-variable differences 116, this synchronization technique may avoid unpredictable behavior of the dependent clock signal 112 during the synchronizing. Consequently, this synchronization technique may eliminate user-perceived transients in audio signals that are provided by a media-transport system that uses timing information in the master clock signal 110 and the dependent clock signal 112. More generally, this synchronization technique may eliminate erratic data transport in cascaded circuits that use the timing information in these clock signals. Thus, the synchronization technique may allow the use of a common time reference across a large locked time domain, even while this time domain is operating and/or is being changed.

Note that the sum output by summation circuit 126 is modified by a loop filter associated with synchronization processing circuit 128. To pre-compensate or correct for this effect (and thus to eliminate unwanted temporal transients in dependent clock signal 112), the synchronization acquisition curve 124 determined by estimation circuit 122 may be based, at least in part, on a transfer function of a feedback loop between an output of the summation circuit 126 and an input of the comparison circuit 114 (i.e., the transfer function associated with synchronization processing circuit 128). For example, the synchronization acquisition curve 124 may be determined by convolution with the transfer function. Alternatively, a multiply-accumulator circuit may be used. This transfer function may be a second-order function that, while adjustable, is known during operation of synchronization circuit 100. In some embodiments, the transfer function corresponds to a matched filter for the loop filter, i.e., the convolution of the matched filter and the loop filter may have unity gain and zero phase.

Moreover, note that if the synchronization acquisition curve 124 is based on the phase difference between the clock signals, there may be a fixed lock time. In these embodiments, synchronization circuit 100 cannot be restarted or reset until the synchronization is complete (e.g., until after the lock time). However, if the synchronization acquisition curve 124 is based on the rate of change of the frequency difference between the clock signals, then synchronization circuit 100 can be restarted or reset at an arbitrary time, because the lock time is decreasing for each subsequent comparison of the state variables for the clock signals.

In some embodiments, synchronization circuit 100 includes fewer or additional components. Moreover, two or more components may be combined into a single component and/or a position of one or more components may be changed.

Components and/or functionality illustrated in these embodiments may be implemented using analog circuits and/or digital circuits, either of which may be disposed on one or more integrated circuits. Transistors in these circuits may include power transistors, bipolar transistors, and/or field-effect transistors, and may use PMOS, NMOS and/or CMOS. Moreover, components and/or functionality in either of these synchronization circuits may be implemented using hardware and/or software (which is described further below with reference to FIG. 5).

Figure 2:
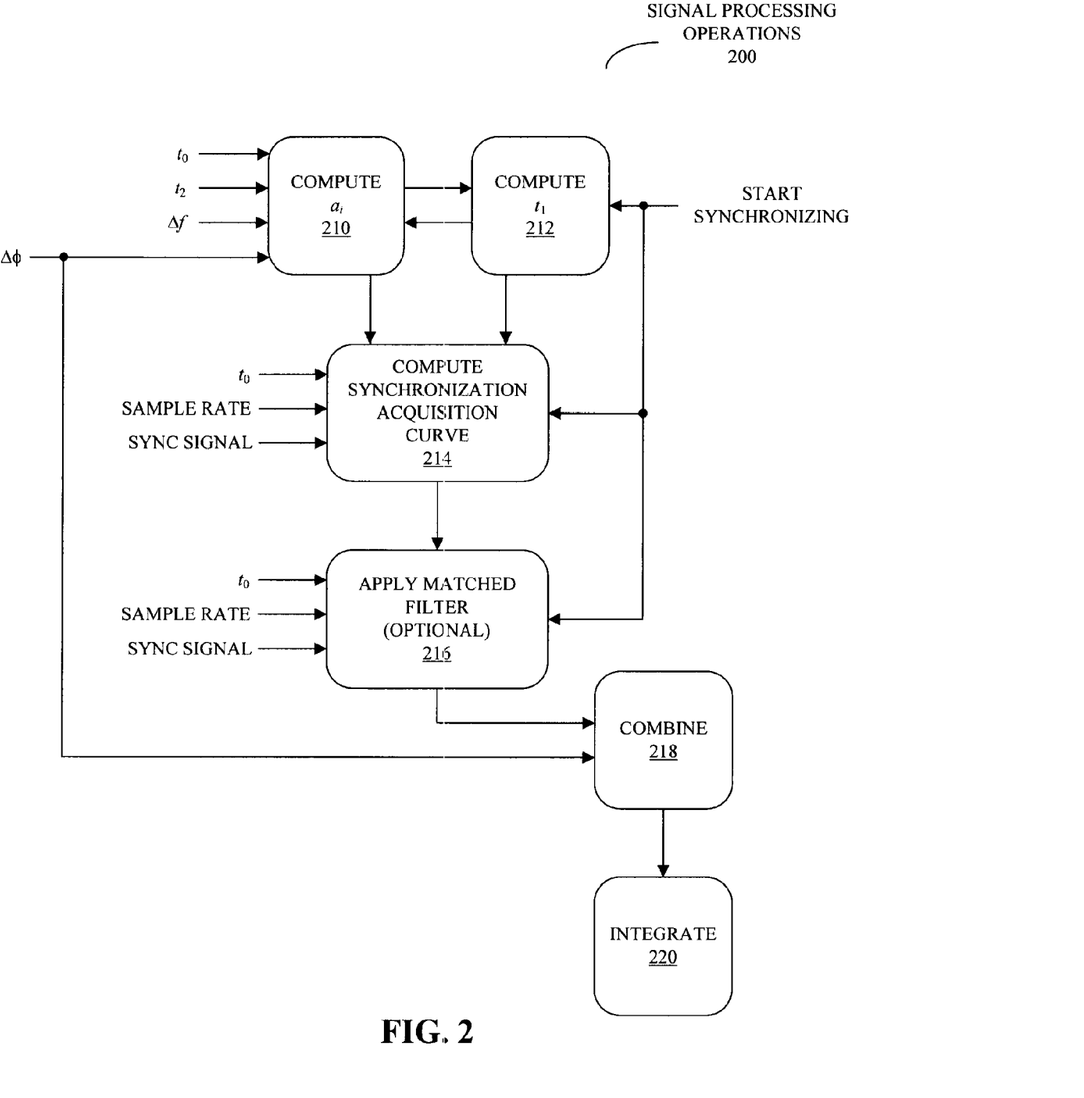
FIG. 2 is a block diagram illustrating signal-processing operations in a synchronization circuit in accordance with an embodiment of the present invention.

FIG. 2 presents a block diagram illustrating signal-processing operations 200 in synchronization circuit 100 (FIG. 1). To facilitate proper behavior during the synchronizing, a synchronization acquisition curve (a phase-difference trajectory in a space of phase-difference versus time) is computed (214) based on state-variable differences between the master clock signal and the dependent clock signal, including phase differences ($\Delta\phi$) and normalized frequency differences ($\Delta\dot{\phi}$) (for example, normalized to the frequency of the master clock signal). This synchronization acquisition curve may be computed based on system requirements or constraints, such as limits on the change in the frequency of the dependent clock signal, the lock time, and the associated desired continuous state variable(s) of the dependent clock signal. (As described further below, the synchronization acquisition curve may be computed using computed values of $a_i$ (210) and $t_1$ (212)). A matched filter may be optionally applied (216) to the synchronization acquisition curve to compensate for the transfer function of the loop filter (represented by an integrate operation 220).

Then, the synchronization acquisition curve and the samples $\Delta\phi$ may be summed or combined (218) to navigate, in a controlled manner, from the initial phase and frequency of the dependent clock signal to the phase and frequency of the master clock signal. For example, the combination (or residual error) may be near or equal to zero at the start of the synchronization (i.e., the initial target phase and frequency provided to synchronization processing circuit 128 in FIG. 1 may be those of the dependent clock signal). Subsequently, the synchronization acquisition curve, and thus the combination, may slowly change the target phase and frequency so that the dependent clock signal is eventually locked to the master clock signal. Consequently, at the end of the synchronization (i.e., at the lock time), the combination may approach zero phase difference and zero frequency difference (i.e., zero slope).

The combination may be used to drive the error loop of a convention integrator or a digital integrator to servo a synthesizer, which determines the dependent clock signal. (In contrast with a phase accumulator or a numerically controlled oscillator, the conventional integrator has the advantage of being free of the intrinsic phase error/modulation terms of the synthesizer.) For example, the combination may be integrated (220) by the loop filter in synchronization processing circuit 128 (FIG. 1).

Note that the sample rate of the synchronization acquisition curve may be higher than the sample rate of $\Delta f$ and $\Delta\phi$. For example, the sampling rate of the synchronization acquisition curve may be 10-100 ns, while the sampling rate of $\Delta f$ and $\Delta\phi$ may be 1 μs. Moreover, the time at the beginning of the synchronization, $t_0$, determines the initial phase. Additionally, the synch signal may indicate the temporal location during the synchronizing.

If the frequency difference between the master clock signal and the dependent clock signal is fixed, a plot of the phase difference versus time is a linear ramp with a slope equal to the fixed frequency difference. The synchronization acquisition curve in this example may have a smooth phase and a linear, bounded frequency contour (or range of frequencies). In general, the synchronization acquisition curve includes one or more quadratic functions and/or one or more cubic functions, such as cubic spline. (Note that a cubic function has a smooth rate of frequency change or second derivative in the space of phase-difference versus time, as opposed to a step change when the synchronization starts, which occurs for the quadratic function.) Moreover, in general the synchronization acquisition curve has one or more segments, such as a quadratic segment and/or a cubic segment.

Figure 3:
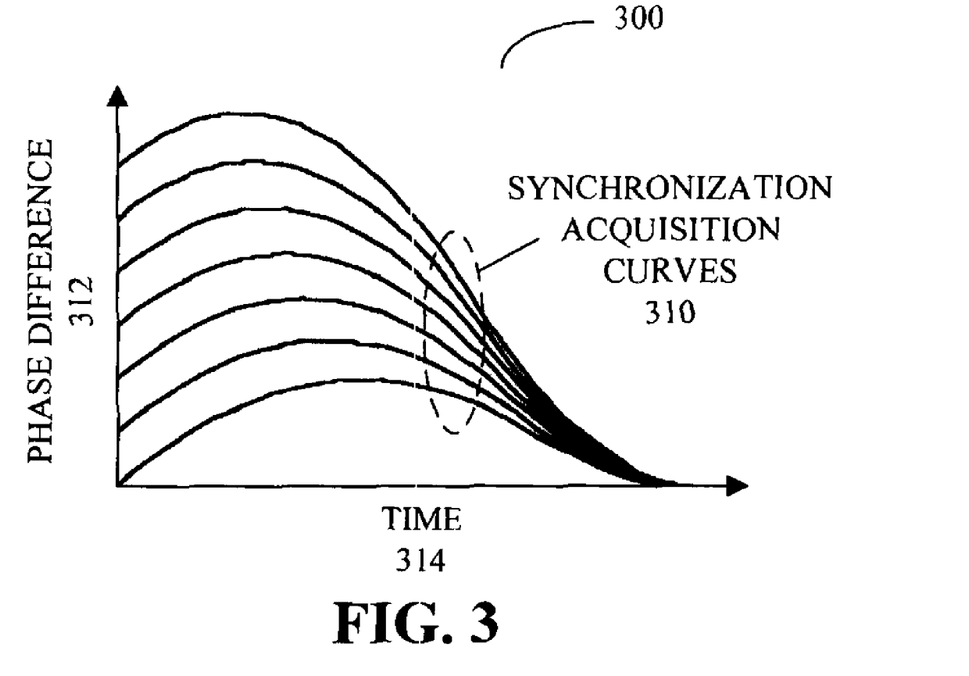
FIG. 3 is a graph of synchronization acquisition curves as a function of time in accordance with an embodiment of the present invention.

FIG. 3 presents a graph 300 of several exemplary synchronization acquisition curves 310, which are phase-difference trajectories in the space of phase difference 312 versus time 314. Each of these synchronization acquisition curves includes two parabolic segments. Note that zero time ($t_0$) determines the phase at the start of the synchronization, $t_1-t_0$ is the time that a given synchronization acquisition curve follows the first parabolic segment, and $t_2-t_1$ is the time that the given synchronization acquisition curve follows the second parabolic segment. Thus, $t_2-t_0$ is the lock time.

In general, the expression for the phase difference during the first parabolic segment in the given synchronization acquisition curve is $$\Delta\varphi(t) = \Delta\varphi(t=t_0) + \Delta f(t=t_0) \cdot (t-t_0) + \frac{a}{2} \cdot (t-t_0)^2,$$

where $\Delta\phi(t)$ is the phase difference between the master clock signal and the dependent clock signal at time t, $\Delta\phi(t=t_0)$ is the phase difference at the start of the synchronization, $\Delta f(t=t_0)$ is the normalized frequency difference at the start of the synchronization, and a is the rate of change of the frequency. Based on this equation, the expression for the two cascaded quadratic segments is $$\Delta\varphi(t) = \Delta\varphi(t=t_0) + \Delta f(t=t_0) \cdot (t-t_0) + \frac{a_0}{2} \cdot (t-t_0)^2 \quad \text{for } t_0 < t < t_1$$

and $$\Delta\varphi(t) = \Delta\varphi(t=t_1) = \Delta f(t=t_1)\cdot(t-t_1) + \frac{a_1}{2}\cdot(t-t_1)^2 \quad \text{for } t_1 < t < t_2.$$

Given $\Delta\phi(t=t_0)$, $\Delta f(t=t_0)$, $\Delta\phi(t=t_2)$, $\Delta f(t=t_2)$ and $t_2$, $t_1$, $a_0$, and $a_1$ can be determined. (In general, $a_0$ has a different value than $a_1$, and note that setting $t_1$ equal to $t_2$ yields one quadratic segment.) For example, setting $a_1 = -a_0$ yields $$a_0 = [\Delta\varphi(t=t_0) - \Delta f(t=t_0)\cdot B \pm$$
$$\frac{\sqrt{(\Delta\varphi(t=t_0))^2 + 2\cdot\Delta\varphi(t=t_0)\cdot\Delta f(t=t_0)\cdot B + 2\cdot(\Delta f(t=t_0))^2\cdot B^2}}{2B^2},$$

where $$B = \frac{t_2 - t_0}{2}, \text{ and } t_1 = \frac{t_0 + t_2}{2} - \frac{\Delta f(t=t_0)}{2a_0}.$$

(As expected, for $\Delta f(t=t_0)$ equal to zero, $t_1$ is the midpoint of $t_0$ and $t_2$.) When computing the synchronization acquisition curve, one of the two roots in the equation for $a_0$ is selected.

Note that the start of the synchronization can be triggered by a variety of events, including: a port in an electronic device being selected or set as a slave port; and/or when hardware is connected or coupled to a port that is already set up as a slave port.

While the preceding embodiment provided illustrations of synchronization acquisition curves 310 that are fixed during the synchronizing and which bound the phase difference and the frequency difference between the clock signals at the start of the synchronization, in other embodiments the synchronization acquisition curve may be updated one or more times during the synchronizing. For example, the synchronization acquisition curve may be updated at each comparison point, i.e., for each subsequent state-variable difference that is computed between the clock signals. Thus, in some embodiments, the synchronizing of the clock signals occurs over a variable lock time (as opposed to the fixed lock time illustrated in the preceding embodiment).

Figure 4:
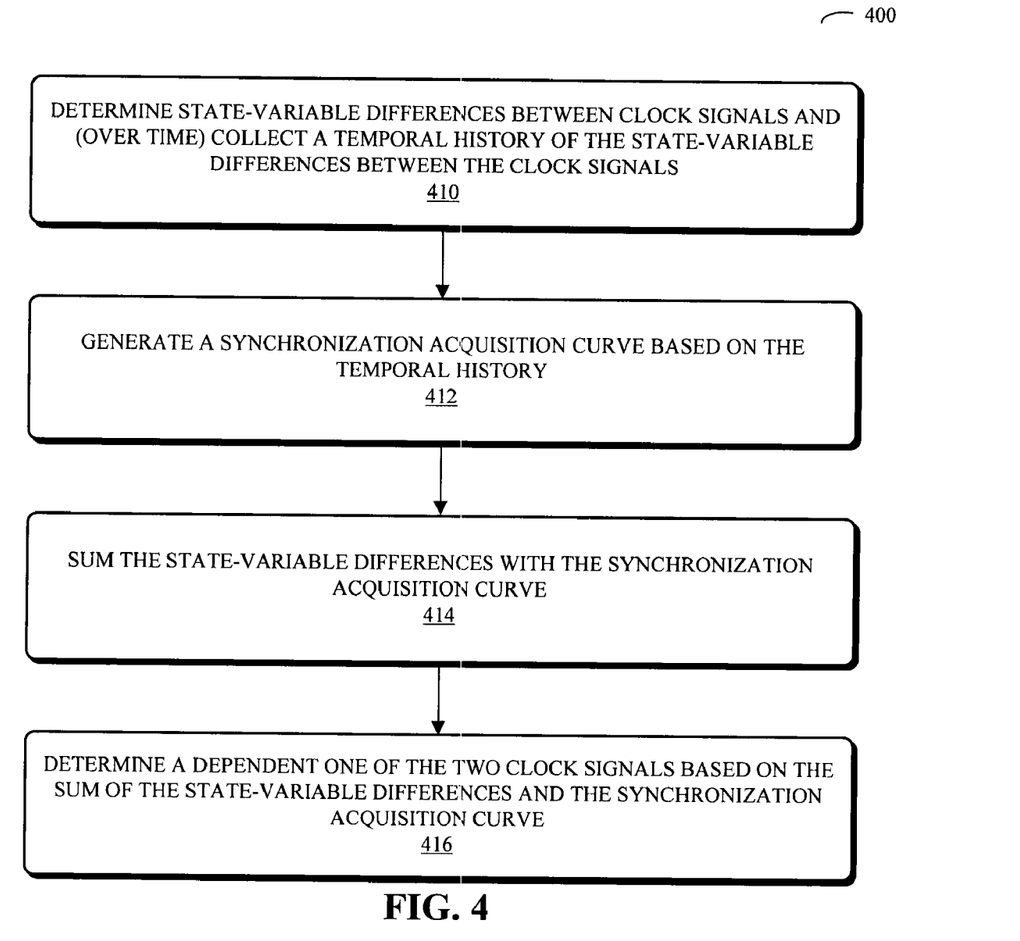
FIG. 4 is a flowchart illustrating a process for synchronizing two clock signals in two timing domains in accordance with an embodiment of the present invention.

We now describe embodiments of a process for synchronizing clock signals. FIG. 4 presents a flowchart illustrating a process 400 for synchronizing two clock signals in two timing domains, which may be performed by a device (such as a synchronization circuit, an electronic device that includes the circuit, or a computer system). During operation, the device determines state-variable differences between the clock signals, and (over time) collects a temporal history of the state-variable differences between the clock signals (410). Then, the device generates a synchronization acquisition curve based on the temporal history (412), and sums the state-variable differences with the synchronization acquisition curve (414). Next, the device determines a dependent one of the two clock signals based on the sum of the state-variable differences and the synchronization acquisition curve (416).

In some embodiments, there may be additional or fewer operations. Moreover, the order of the operations may be changed and/or two or more operations may be combined into a single operation. For example, generating (412) the synchronization acquisition curve may include generating the coefficients of a polynomial and then subsequently generating the synchronization acquisition curve point by point. After generating a point, the current state-variable difference(s) may be summed with the current point and used to determine (414) the dependent one of the two clock signals. Operations 412 and 414 may be repeated on a point-by-point basis until the lock time.

Figure 5:
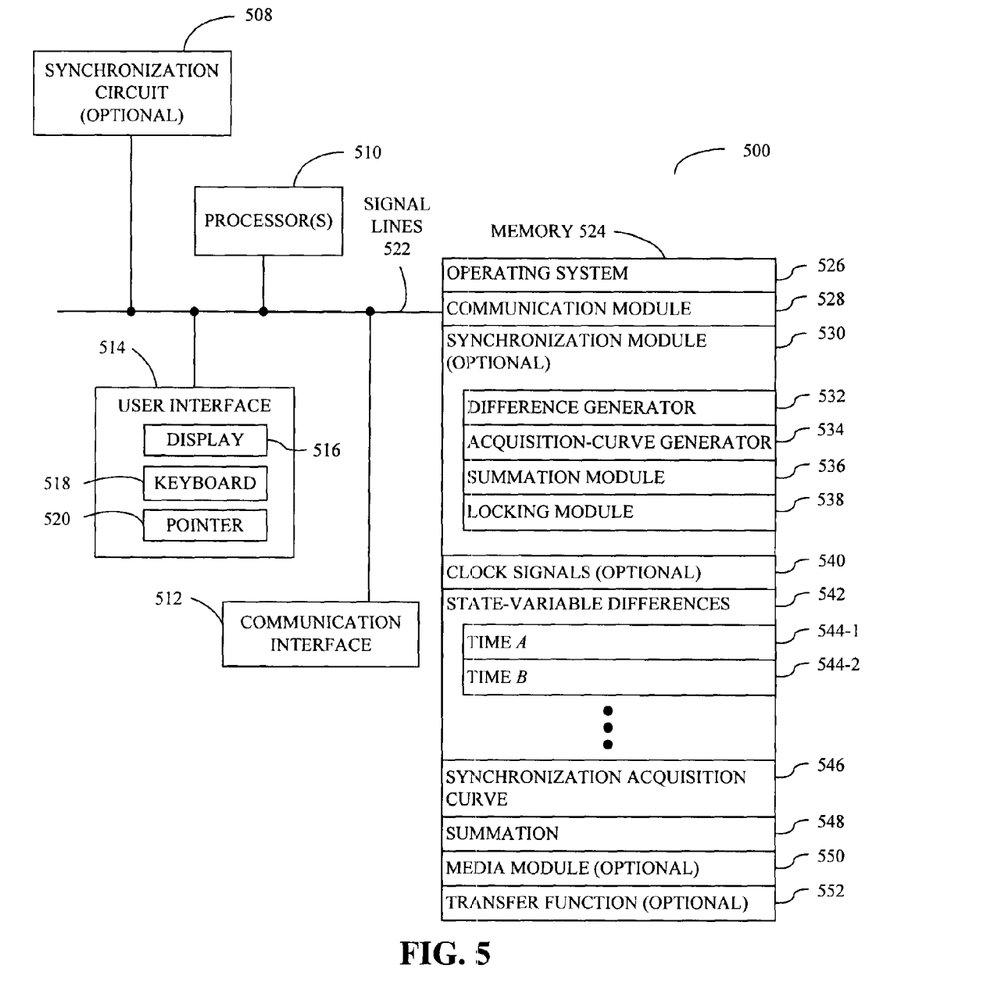
FIG. 5 is a block diagram of an electronic device in accordance with an embodiment of the present invention.

We now describe embodiments of an electronic device. FIG. 5 presents a block diagram of an electronic device 500. This electronic device includes: an optional synchronization circuit 508, one or more processors 510, a communication interface 512, a user interface 514, and one or more signal lines 522 coupling these components together. The one or more processing units 510 may support parallel processing and/or multi-threaded operation, the communication interface 512 may have a persistent communication connection, and the one or more signal lines 522 may constitute a communication bus. Moreover, the user interface 514 may include: a display 516, a keyboard 518, and/or a pointer 520, such as a mouse.

Memory 524 in electronic device 500 may include volatile memory and/or non-volatile memory. More specifically, memory 524 may include: ROM, RAM, EPROM, EEPROM, flash memory, one or more smart cards, one or more magnetic disc storage devices, and/or one or more optical storage devices. Memory 524 may store an operating system 526 that includes procedures (or a set of instructions) for handling various basic system services for performing hardware-dependent tasks. Additionally, memory 524 may store procedures (or a set of instructions) in a communication module 528. These communication procedures may be used for communicating with one or more additional electronic devices, such as computers and/or servers (including computers and/or servers that are remotely located with respect to electronic device 500).

Memory 524 may also include multiple program modules (or a set of instructions), including optional synchronization module 530. This optional synchronization module may include: a difference generator 532 (or a set of instructions), an acquisition-curve generator 534 (or a set of instructions), a summation module 536 (or a set of instructions), and a locking module 538 (or a set of instructions). In electronic device 500, synchronization of optional clock signals 540 (which may or may not be stored in memory 524) may be performed by optional synchronization circuit 508 and/or optional synchronization module 530 (i.e., using hardware and/or software).

For example, difference generator 532 may determine state-variable differences 542 of optional clock signals 540, such as phase differences and/or frequency differences between the optional clock signals 540. Moreover, state-variable differences 542 may include multiple time entries, such as one or more state-variable differences at time A 544-1 and one or more state-variable differences at time B 544-2, which collectively comprise a temporal history.

Then, acquisition-curve generator 534 may generate a synchronization acquisition curve 546 based on state-variable differences 542. This synchronization acquisition curve may correspond to (i.e., may be or may be a function of) a smooth and continuous function of time of the phase difference between optional clock signals 540. Moreover, this smooth and continuous function may include: a linear dependence of the phase difference on time, a quadratic dependence of the phase difference on time, and/or a cubic dependence of the phase difference on time. Thus, at the beginning of the synchronization of optional clock signals 540, the synchronization acquisition curve 546 may be based on a phase-difference trajectory as a function of time, which includes: a phase difference, a frequency difference, and/or a rate of change of the frequency difference between optional clock signals 540.

Summation module 536 may sum one or more of the state-variable differences 542 with the synchronization acquisition curve 546 to produce summation 548. Next, locking module 538 may determine one or more dependent clock signals in optional clock signals 540 based on summation 548.

Optional synchronization circuit 508 and/or optional synchronization module 530 may allow the one or more dependent clock signals to be synchronized with a master clock signal in optional clock signals 540 without a discontinuous temporal transient in one or more state variables of the dependent clock signal (such as the phase, frequency, and/or the rate of change of the frequency of the one or more dependent clock signals). This may allow optional media module 550 to operate without synchronization-related transients that can be perceived by users.

In some embodiments, the synchronization acquisition curve 546 is determined based, at least in part, on an optional transfer function 552, such as that corresponding to a feedback loop in optional synchronization circuit 508 and/or at least some of the operations performed by optional synchronization module 530.

Instructions in the various modules in the memory 524 may be implemented in: a high-level procedural language, an object-oriented programming language, and/or in an assembly or machine language. Moreover, the programming language may be compiled or interpreted, e.g., configurable or configured to be executed by the one or more processing units 510.

Although electronic device 500 is illustrated as having a number of discrete components, FIG. 5 is intended to be a functional description of the various features that may be present in electronic device 500 rather than a structural schematic of the embodiments described herein. In practice, and as recognized by those of ordinary skill in the art, the functions of electronic device 500 may be distributed over a large number of electronic devices, with various groups of the electronic devices performing particular subsets of the functions.

In some embodiments, some or all of the functionality of electronic device 500 may be implemented in one or more integrated circuits, such as application-specific integrated circuits (ASICs) and/or one or more digital signal processors (DSPs). Moreover, in some embodiments electronic device 500 includes: a server, a laptop computer, a personal computer, a server, a work station, a mainframe computer, a digital signal processor, a portable-computing device, a personal organizer, a cellular telephone, a personal digital assistant, a game console, an MP3 player, a device controller, and/or a computational engine within an appliance.

Electronic device 500 may include fewer components or additional components. Moreover, two or more components may be combined into a single component and/or a position of one or more components may be changed. Note that in some embodiments the functionality of electronic device 500 may be implemented more in hardware and less in software, or less in hardware and more in software, as is known in the art.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over diverse media on the Internet or, for example, via email. Note that physical files may be implemented on machine-readable media such as: 4 mm magnetic tape, 8 mm magnetic tape, 3½ inch floppy media, a hard-disk drive, flash memory, CDs, DVDs, and so on.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A synchronization circuit, comprising:
a comparison circuit to determine state-variable differences between a first clock signal in a first timing domain and a second clock signal in a second timing domain;
an aggregation circuit, electrically coupled to the comparison circuit, to collect a temporal history of the state-variable differences between the first clock signal and the second clock signal;
an estimation circuit, electrically coupled to the aggregation circuit, to generate a synchronization acquisition curve based on the temporal history;
a summation circuit, electrically coupled to the comparison circuit and the estimation circuit, to sum the state-variable differences output by the comparison circuit with the synchronization acquisition curve; and
a synchronization processing circuit, electrically coupled to the summation circuit, to determine the second clock signal based on the sum of the state-variable differences and the synchronization acquisition curve.

2. The synchronization circuit of claim 1, wherein the sum of the state-variable differences and the synchronization acquisition curve is approximately zero at the beginning of the synchronization of the first clock signal and the second clock signal.

3. The synchronization circuit of claim 1, wherein the synchronization acquisition curve facilitates synchronizing of the first clock signal and the second clock signal without a discontinuous temporal transient in a state variable of the second clock signal.

4. The synchronization circuit of claim 3, wherein the state variable includes a phase of the second clock signal.

5. The synchronization circuit of claim 3, wherein the state variable includes a frequency of the second clock signal.

6. The synchronization circuit of claim 3, wherein the state variable includes a rate of change of the frequency of the second clock signal.

7. The synchronization circuit of claim 3, wherein a magnitude of a phase change in the second clock signal during a time interval is less than a predetermined value when synchronizing the first clock signal and the second clock signal.

8. The synchronization circuit of claim 3, wherein a magnitude of a frequency change in the second clock signal during a time interval is less than a predetermined value when synchronizing the first clock signal and the second clock signal.

9. The synchronization circuit of claim 1, wherein, at a given time, the temporal history includes a phase difference and a frequency difference between the first clock signal and the second clock signal.

10. The synchronization circuit of claim 1, wherein the synchronization acquisition curve corresponds to a smooth and continuous function of time of a phase difference between the first clock signal and the second clock signal.

11. The synchronization circuit of claim 10, wherein the smooth and continuous function includes a linear dependence of the phase difference on time, a quadratic dependence of the phase difference on time, or a cubic dependence of the phase difference on time.

12. The synchronization circuit of claim 1, wherein, at the beginning of the synchronization of the first clock signal and the second clock signal, the synchronization acquisition curve is based on a phase-difference trajectory as a function of time, which includes a phase difference, a frequency difference, and a rate of change of the frequency difference between the first clock signal and the second clock signal.

13. The synchronization circuit of claim 1, wherein the synchronization acquisition curve is determined based on a transfer function of a feedback loop between an output of the summation circuit and an input of the comparison circuit, which includes the synchronization processing circuit.

14. The synchronization circuit of claim 1, wherein the synchronization circuit is disposed on an integrated circuit.

15. A synchronization circuit, comprising:
a comparison circuit to determine state-variable differences between a first clock signal in a first timing domain and a second clock signal in a second timing domain;
means, electrically coupled to the comparison circuit, for collecting a temporal history of the state-variable differences between the first clock signal and the second clock signal;
an estimation circuit, electrically coupled to the means, to generate a synchronization acquisition curve based on the temporal history;
a summation circuit, electrically coupled to the comparison circuit and the estimation circuit, to sum the state-variable differences output by the comparison circuit with the synchronization acquisition curve; and
a synchronization processing circuit, electrically coupled to the summation circuit, to determine the second clock signal based on the sum of the state-variable differences and the synchronization acquisition curve.

16. An electronic device, comprising a synchronization circuit, wherein the synchronization circuit includes:
a comparison circuit to determine state-variable differences between a first clock signal in a first timing domain and a second clock signal in a second timing domain;
an aggregation circuit, electrically coupled to the comparison circuit, to collect a temporal history of the state-variable differences between the first clock signal and the second clock signal;
an estimation circuit, electrically coupled to the aggregation circuit, to generate a synchronization acquisition curve based on the temporal history;
a summation circuit, electrically coupled to the comparison circuit and the estimation circuit, to sum the state-variable differences output by the comparison circuit with the synchronization acquisition curve; and
a synchronization processing circuit, electrically coupled to the summation circuit, to determine the second clock signal based on the sum of the state-variable differences and the synchronization acquisition curve.

17. A method for synchronizing a first clock signal in a first timing domain and a second clock signal in a second timing domain, comprising:
determining state-variable differences between the first clock signal and the second clock signal;
collecting a temporal history of the state-variable differences between the first clock signal and the second clock signal;
generating a synchronization acquisition curve based on the temporal history;
summing the state-variable differences with the synchronization acquisition curve; and
determining the second clock signal based on the sum of the state-variable differences and the synchronization acquisition curve.

18. The method of claim 17, wherein the sum of the state-variable differences and the synchronization acquisition curve is approximately zero at the beginning of the synchronization of the first clock signal and the second clock signal.

19. The method of claim 17, wherein the synchronization acquisition curve facilitates synchronizing of the first clock signal and the second clock signal without a discontinuous temporal transient in a state variable of the second clock signal.

20. The method of claim 19, wherein the state variable includes a phase of the second clock signal.

21. The method of claim 19, wherein the state variable includes a frequency of the second clock signal.

22. The method of claim 19, wherein the state variable includes a rate of change of the frequency of the second clock signal.

23. The method of claim 19, wherein a magnitude of a phase change in the second clock signal during a time interval is less than a predetermined value when synchronizing the first clock signal and the second clock signal.

24. The method of claim 19, wherein a magnitude of a frequency change in the second clock signal during a time interval is less than a predetermined value when synchronizing the first clock signal and the second clock signal.

25. The method of claim 17, wherein, at a given time, the temporal history includes a phase difference and a frequency difference between the first clock signal and the second clock signal.

26. The method of claim 17, wherein the synchronization acquisition curve corresponds to a smooth and continuous function of a phase difference between the first clock signal and the second clock signal on time.

27. The method of claim 26, wherein the smooth and continuous function includes a linear dependence of the phase difference on time, a quadratic dependence of the phase difference on time, or a cubic dependence of the phase difference on time.

28. The method of claim 17, wherein, at the beginning of the synchronization of the first clock signal and the second clock signal, the synchronization acquisition curve is based on a phase-difference trajectory as a function of time, which includes a phase difference, the frequency difference, and a rate of change of the frequency difference between the first clock signal and the second clock signal.

29. The method of claim 17, wherein the synchronization acquisition curve is determined based on a transfer function of a feedback loop between an output of the summation circuit and an input of the comparison circuit, which includes the synchronization processing circuit.

30. A computer-program product for use in conjunction with a computer system, the computer-program product comprising a computer-readable storage medium and a computer-program mechanism embedded therein for configuring the computer system for synchronizing a first clock signal in a first timing domain and a second clock signal in a second timing domain, the computer-program mechanism including:

instructions for determining state-variable differences between the first clock signal and the second clock signal;
instructions for collecting a temporal history of the state-variable differences between the first clock signal and the second clock signal;
instructions for generating a synchronization acquisition curve based on the temporal history;
instructions for summing the state-variable differences with the synchronization acquisition curve; and
instructions for determining the second clock signal based on the sum of the state-variable differences and the synchronization acquisition curve.

31. A computer system, comprising:
a processor;
memory;
a program module, wherein the program module is stored in the memory and configured to be executed by the processor, the program module including instructions for synchronizing a first clock signal in a first timing domain and a second clock signal in a second timing domain, wherein the instructions include:
instructions for determining state-variable differences between the first clock signal and the second clock signal;
instructions for collecting a temporal history of the state-variable differences between the first clock signal and the second clock signal;
instructions for generating a synchronization acquisition curve based on the temporal history;
instructions for summing the state-variable differences with the synchronization acquisition curve; and
instructions for determining the second clock signal based on the sum of the state-variable differences and the synchronization acquisition curve.

* * * * *